United States Patent
Ikarashi et al.

(12)

(10) Patent No.: US 7,288,934 B1
(45) Date of Patent: Oct. 30, 2007

(54) ELECTRONIC DEVICE INCORPORATING MAGNETORESISTIVE ELEMENTS FOR SENSING BOTH N AND S MAGNETIC POLES

(75) Inventors: Masahiro Ikarashi, Niigata-ken (JP); Kazushige Seshimo, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 11/678,868

(22) Filed: Feb. 26, 2007

(30) Foreign Application Priority Data

Sep. 7, 2006 (JP) ............................. 2006-242982

(51) Int. Cl.
*G01R 33/09* (2006.01)
*H04R 3/00* (2006.01)
(52) U.S. Cl. ............. 324/207.21; 324/252; 379/433.13
(58) Field of Classification Search ........... 324/207.21, 324/252, 260–261, 244; 455/575.3; 379/433.13
See application file for complete search history.

(56) References Cited

U.S. PATENT DOCUMENTS 6,167,288 A * 12/2000 Ishihara ...................... 455/566

6,628,974 B1 * 9/2003 Lim ......................... 455/575.3

FOREIGN PATENT DOCUMENTS

JP 2006-020272 1/2006
JP 2006-128982 5/2006

* cited by examiner

*Primary Examiner*—Bot LeDynh
(74) *Attorney, Agent, or Firm*—Brinks Hofer Gilson & Lione

(57) ABSTRACT

An electronic device has a display housing (second body), an operation housing (first body), and a connection member connecting the display housing to the operation housing. A magnet is provided within an intermediate section of the connection member. A first magnetoresistive effect element is provided within the operation housing, and a second magnetoresistive effect element is provided within the display housing. The magnetoresistive effect elements and the magnet are disposed such that the magnetoresistive effect elements can sense a horizontal magnetic field to enable detection of both a open/closed state of the electronic device and a normal/reversed state of the display housing.

9 Claims, 7 Drawing Sheets

ELECTRONIC DEVICE INCORPORATING MAGNETORESISTIVE ELEMENTS FOR SENSING BOTH N AND S MAGNETIC POLES

This application claims the benefit of priority under 35 U.S.C. § 119 to Japanese Patent Application No. 2006-242982, filed Sep. 7, 2006, which is hereby incorporated by reference in its entirety.

BACKGROUND OF THE INVENTION

1. Field of the Invention

The present invention relates to an electronic device having a first body and a second body hinged to each other through a connecting member so as to be folded down, i.e., closed, and unfolded, i.e., opened for use, where the second body is reversible such that either side thereof can face the user. More particularly, the present invention pertains to an electronic device capable of detecting whether the electronic device is in an opened state or in a closed state, and whether the second member is in a normal state or a reversed state.

2. Description of the Related Art

As disclosed in Japanese unexamined patent publication Nos. JP-A-2006-20272 and JP-A-2006-128982, flip phones having a display housing coupled to an operation housing via a hinge section is used in an open state with the display housing being flipped open, either in a normal state for making or receiving a telephone call or a mail for example, or a reversed state in which the display housing is reversed to allow activation of a digital camera for example.

Such a flip phone requires magnetic sensors to detect whether the phone is opened or closed, as well as whether the display housing is in the normal state or reversed.

Conventional magnetic sensors typically rely on Hall elements. JP-A-2006-20272, for example, proposes to use two magnetic sensors and two magnets to enable detection of the open/closed state of the phone and the normal/reversed state of the display housing.

In order to comply with demands for smaller and more multifunctional flip phones with more functional elements, it is desirable to reduce the number of magnetic sensors and magnets. Unfortunately, the above patent documents do not refer to the reduction in number of installed elements, nor their locations.

SUMMARY OF THE INVENTION

Accordingly, it is an object of the present invention to provide an electronic device which has a first body and a reversible second body hinged to the first body, and which requires only one magnet in combination with two magnetoresistive effect elements to detect both an open/closed state of the electronic device and a normal/reversed state of a second body coupled to a first body.

According to an aspect of the present invention, there is provided an electronic device having a first body, a second body, and a connection member located between the first and second bodies. The connection member couples the second body to the first body to enable the second body to be flipped between an open and a closed state. The connection member also reversibly supports the second body. The electronic device includes a magnet provided within the connection member; a first magnetoresistive effect element provided within the first body and capable of changing electrical resistance thereof under the influence of an external magnetic field, where the first magnetoresistive effect element is disposed at a position where the first magnetoresistive effect element approaches the magnet so as to sense the magnetic field from the magnet when the second body is flipped closed over the first body. A second magnetoresistive effect element is provided within the second body and is capable of changing electrical resistance thereof under the influence of an external magnetic field, where the second magnetoresistive effect element is disposed at a position where the second magnetoresistive effect element approaches the magnet so as to sense the magnetic field from the magnet when the second body is reversed from a normal state or returned from the reversed state to the normal state; wherein the magnet is applies a horizontal magnetic field in a direction parallel to a film surface of the layered structure of either of the first and second magnetoresistive effect elements when the second body is flipped closed over the first body or when the second body is reversed from the normal state or returned to the normal state.

As described above, the present invention enables detection of both the open/closed state of the electronic device and the normal/reversed state of the second body by means of one magnet in combination with two magnetoresistive effect elements.

It is therefore possible to reduce the number of magnets, thus accommodating the demands for reducing the size of electronic devices.

Hall elements, which have been conventionally used as magnetic sensors sense a vertical magnetic field component on the element surface and are required to be disposed in the vicinity of the magnetic pole to be detected. To detect both the open/closed state of the electronic device and the normal/reversed state of the second body, two Hall elements and two magnets are required as described in JP-A-2006-20272.

In contrast, the magnetoresistive effect elements used in the embodiment of the present invention each sense a horizontal magnetic field applied in a direction parallel to their film surfaces even if the external magnetic field is weak. Accordingly, only one magnet in combination with two magnetoresistive effect elements are used to detect both the open/closed state of the electronic device and the normal/reversed state of the second body, when the magnet and magnetoresistive effect elements are disposed within the electronic device.

In order to detect both the open/closed state of the electronic device and the normal/reversed state of the second body, the electronic device is preferably arranged as follows. In a state in which the second body is flipped open and the first and second bodies are aligned along a lengthwise direction with the connection member therebetween, the magnet is offset to the right or left side of a widthwise center axis orthogonal to the lengthwise direction. The first magnetoresistive effect element is located on the same side as the magnet with respect to the widthwise center axis, while the second magnetoresistive effect element is offset to the same side as or opposite side to the magnet with respect to the widthwise center axis.

In order to detect both the open/closed state of the electronic device and the normal/reversed state of the second body, it is also preferred that the connection member includes a hinge section and an intermediate section, where the hinge section is fixed to the first body. The intermediate section is supported by a first shaft extending through the hinge section so as to be rotatable thereabout together with the second body in the opening and closing directions. The intermediate section has a second shaft disposed orthogonally to the first shaft so as to allow the second body to be reversed from the normal state and returned to the normal state, and the magnet is disposed within the intermediate section.

The second body may have a first side which, when the second body is in the normal state and flipped closed over the first body, faces the first body. The second body also has a second side opposite the first side. The electronic device permits detection of four states of the electronic device. The four detectable states include: (1) a first state in which the second body is flipped closed over the first body and the first face of the second body and a front face of the first body face each other; (2) a second state in which the second body is flipped open from the first state and the first face of the second body and the front face of the first body are exposed in the same direction; (3) a third state in which the second body is reversed from the second state such that the second face of the second body and the front face of the first body are exposed in the same direction; (4) and a fourth state in which the second body is flipped closed from the third state such that the second face of the second body and the front face of the first body face inside.

The electronic device may be configured such that the first side of the second body is provided with a display screen, and the front face of the first body is provided with elements used for operation of the electronic device. Practically, this configuration may be implemented as a flip phone.

Thus, the electronic device of the present invention is implemented such that both the open/closed state of the device and the normal/reversed state of the second body can be detected by using only one magnet in combination with two magnetoresistive effect elements.

DESCRIPTION OF THE PREFERRED EMBODIMENT

In the figures, the X1 and X2 directions represent the widthwise directions, the Y direction represents the lengthwise direction, and the Z direction represents the height direction. The X, Y, and Z directions are in an orthogonal relationship with one another.

Figure 1:
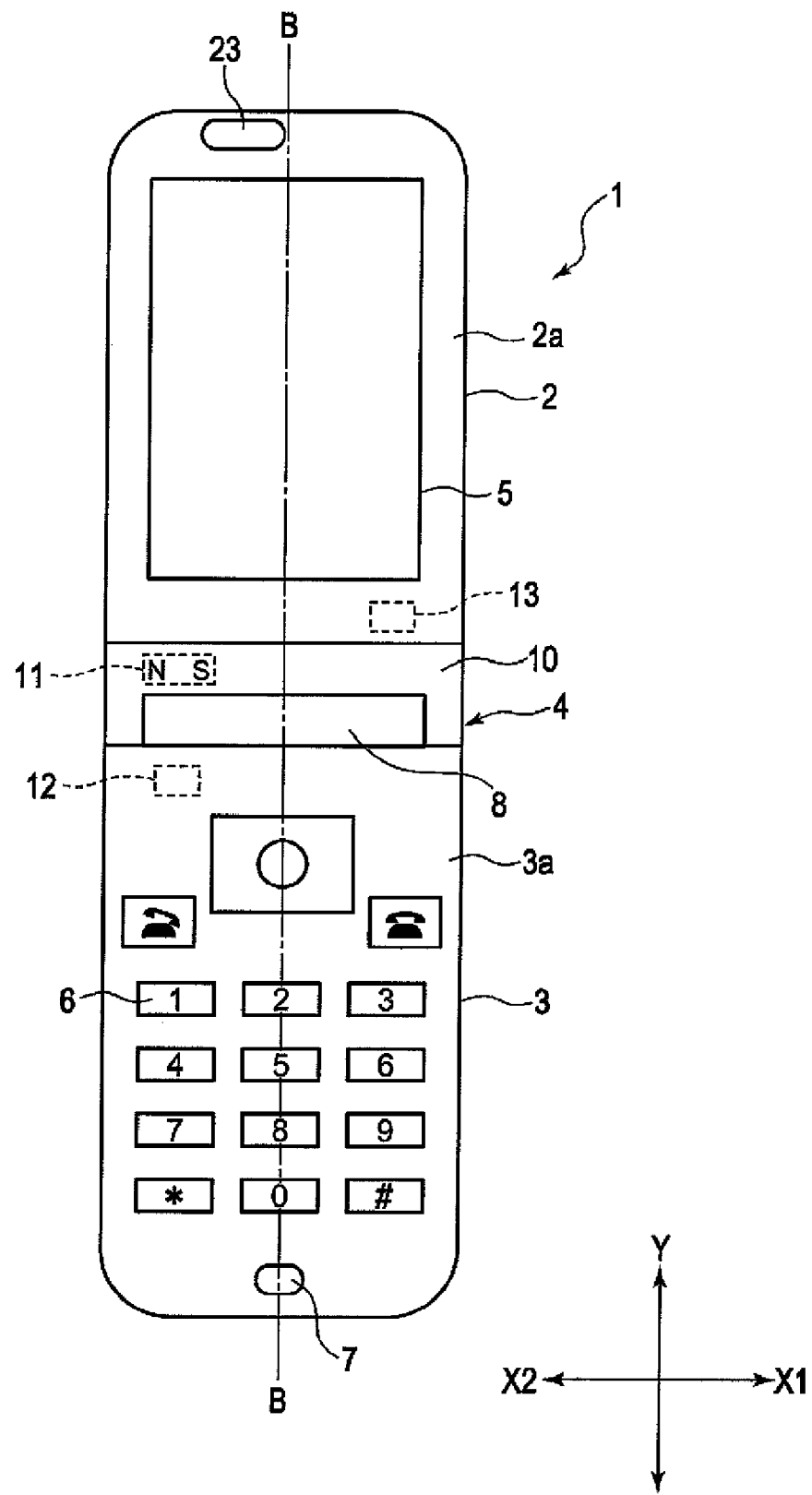
FIG. 1 is a plan view of a flip phone in an opened state (second state)
Figure 3:
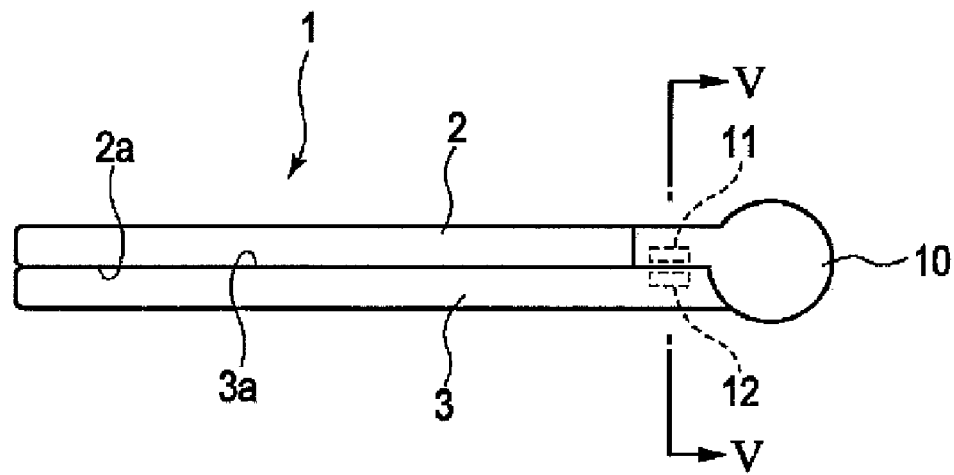
FIG. 3 is a side view of the flip phone in a closed state (first state)
Figure 5:
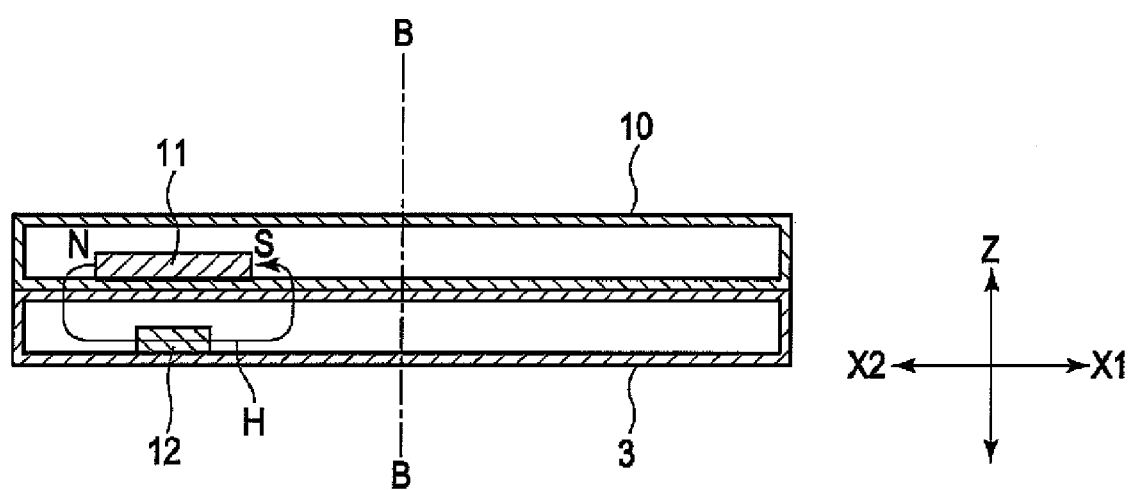
FIG. 5 is a partial sectional view of the flip phone in FIG. 3, taken along the line 5-5 and viewed in the direction of the arrow.

A flip phone 1 has four states which will be referred to hereinafter as a "first state," "second state," "third state," and a "fourth state." In the first state, the flip phone 1 of the preferred embodiment of the present invention is flipped closed, as shown in FIGS. 3 and 5. In the second state, the flip phone 1 is open, as shown in FIG. 1. In the third state, a display housing 2 of the flip phone 1 is reversed from the direction shown in FIG. 6 through 180° to the position shown in FIG. 7. In the fourth state, the flip phone 1 is flipped closed from the state shown in FIG. 7.

Figure 2:
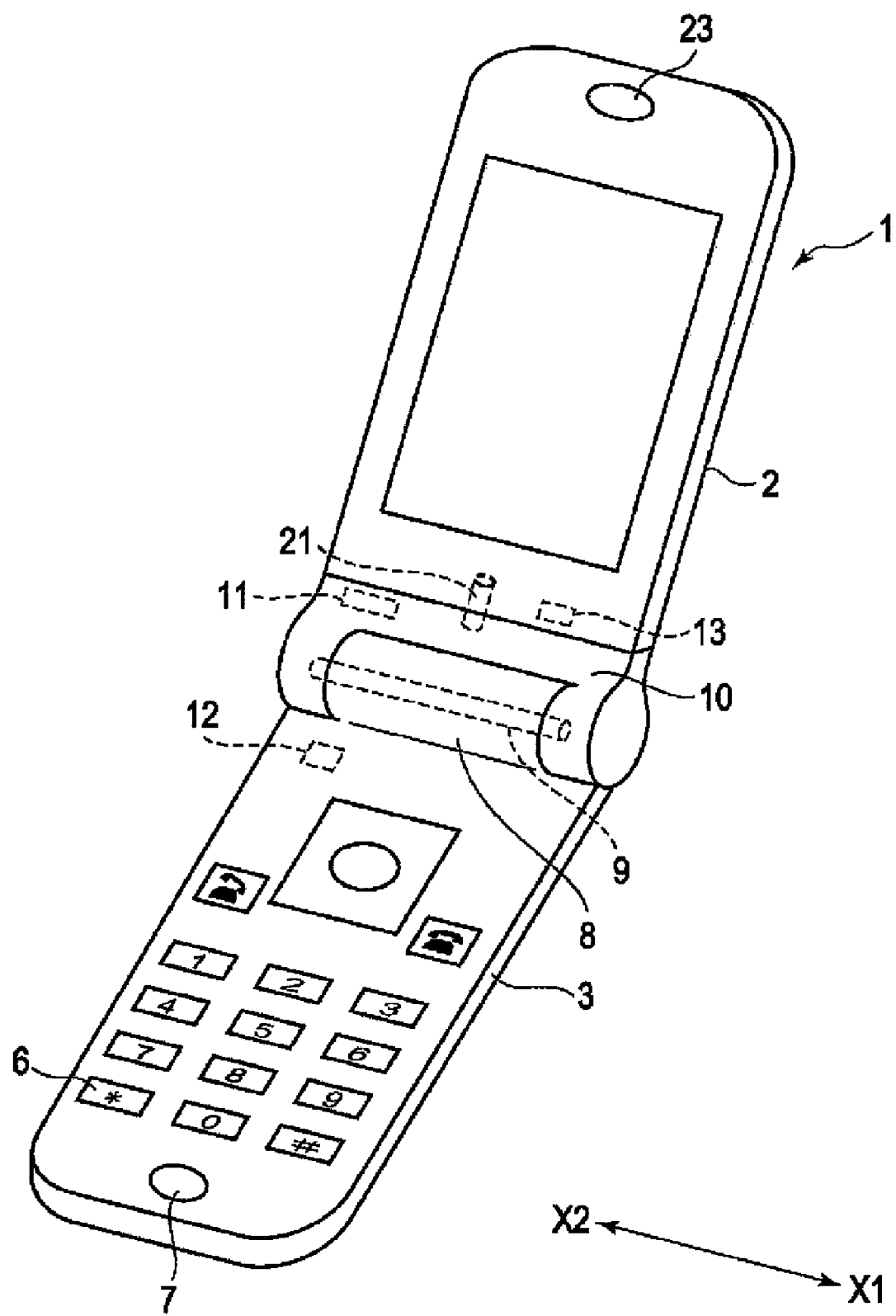
FIG. 2 is a perspective view of the flip phone shown in FIG. 1.

The display housing (second body) 2 of the flip phone 1 in the embodiment shown in FIGS. 1 and 2 is coupled to an operation housing (first body) 3 via a connection member 4.

When the flip phone 1 is flipped open as shown in FIG. 1, a display face (first face) 2a equipped with a liquid crystal display or other display screen 5 of the display housing 2 and an operation face (front face) 3a equipped with various operation buttons 6 of the operation housing 3 are exposed in the same direction.

The display housing 2 has a speaker 23 in the display face 2a, while the operation housing 3 has a microphone 7 in the operation face 3a.

As shown in FIGS. 1 and 2, the connection member 4 includes a hinge section 8 and an intermediate section 10. The hinge section 8 is fixed to the operation housing 3. The intermediate section 10 is rotatably connected to a first shaft 9 extending through the hinge section 8 in the widthwise direction (X1-X2 direction in the figures) and rotates about the axis of the first shaft 9 together with the display housing 2 in the opening and closing directions.

The intermediate section 10 has a second shaft 21 disposed at the widthwise center of the intermediate section 10 and extending in the direction orthogonal to the first shaft 9. The display housing 2 is connected to the second shaft 21 and is rotatable about the axis of the second shaft 21. Thus, the flip phone 1 in this embodiment can be switched from the second state in FIG. 1 to the third state in FIG. 7 by reversing the display housing 2.

A single magnet 11 is provided within the intermediate section 10, in an area located to the left of the lengthwise axis B-B extending in the Y direction across the widthwise (X direction) center of the flip phone 1 when the phone is flipped open and its lengthwise direction is aligned with the Y direction as shown in FIG. 1.

The magnet 11 is placed with its N and S magnetic poles pointing in the widthwise direction (X1-X2 direction) as shown in FIG. 1.

A second magnetoresistive effect element 13 is provided within the display housing (second body) 2 in an area to the right of the lengthwise axis B-B. A a first magnetoresistive effect element 12 is provided within the operation housing (first body) 3, in an area to the left of the axis B-B.

In this embodiment, the first magnetoresistive effect element 12 is aligned with the magnet 11 in the height direction (Z direction) when the phone is in the first state shown FIG. 5. In this state, the center of the first magnetoresistive effect element 12 need not be exactly aligned with that of the magnet 11 in the height direction. The first magnetoresistive effect element 12 may be located slightly offset in the X1 or X2 direction for example, insofar as the first magnetoresistive effect element 12 can sense a horizontal magnetic field from the magnet 11. In the third state shown in FIG. 7, the second magnetoresistive effect element 13 is aligned with the magnet 11 in the lengthwise direction (Y direction). In this state, the center of the second magnetoresistive effect element 13 need not be exactly aligned with that of the magnet 11 in the lengthwise direction. The second magnetoresistive effect element 13 may be located at a position slightly offset in the X1 or X2 direction for example, insofar as the second magnetoresistive effect element 13 can sense a horizontal magnetic field from the magnet 11.

Figure 8:
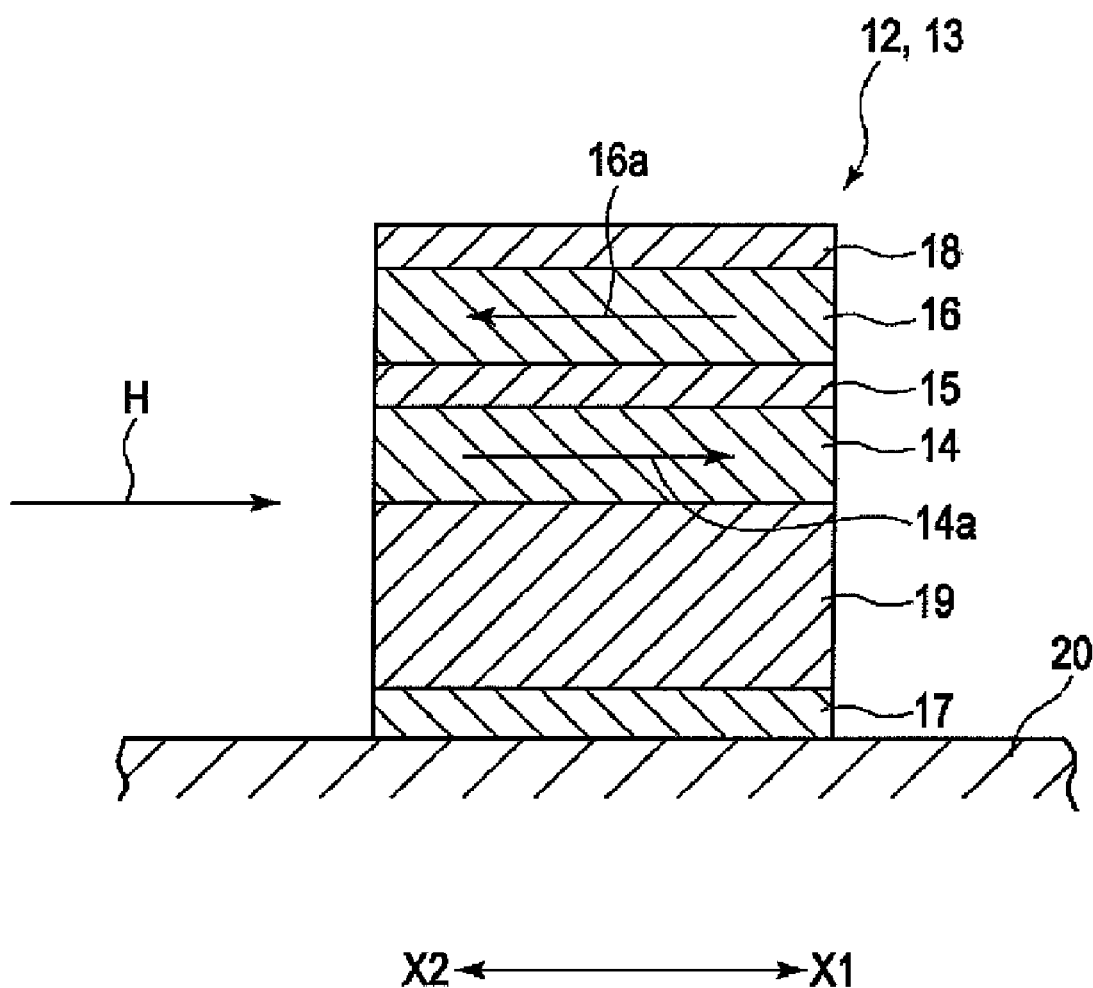
FIG. 8 is a partial sectional view of a magnetoresistive effect element (GMR element) used in the embodiment of the present invention.

As shown in FIG. 8, the first and second magnetoresistive effect elements 12 and 13 each has a layered structure built up on an installation surface 20. The layered structure includes, from the bottom to the top: an antiferromagnetic layer 19 of an antiferromagnetic material such as iridium manganese (IrMn) or platinum manganese (PtMn) alloy; a fixed magnetic layer 14 of a ferromagnetic material such as nickel-iron (NiFe) or cobalt-iron (CoFe) alloy; a nonmagnetic material layer 15 of a nonmagnetic material such as copper (Cu), and a free magnetic layer 16 of a ferromagnetic material such as NiFe or CoFe alloy. To arrange crystal orientation, a seed layer 17 of a nickel-iron-chromium (NiFeCr) alloy or chromium (Cr) may optionally be provided below the antiferromagnetic layer 13 as shown in the embodiment shown in FIG. 8. A protective layer 18 of tantalum (Ta) or the like is also provided on the free magnetic layer 16.

Because the antiferromagnetic layer 19 is formed adjacent to the fixed magnetic layer 14 in the magnetoresistive effect elements 12 and 13, an exchange coupling magnetic field (Hex) is produced at an interface between the antiferromagnetic layer 19 and the fixed magnetic layer 14 and causes the direction of magnetization 14a of the fixed magnetic layer 14 to be fixed in one direction, once heat treatment in the magnetic field is performed. In FIG. 8, the direction of magnetization 14a is fixed in the X1 direction.

The direction of magnetization 16a of the free magnetic layer 16, in the embodiment shown in FIG. 8 for example, is parallel to the direction of magnetization 14a of the fixed magnetic layer 14, but in the opposite direction, i.e., pointing the X2 direction. Unlike the fixed magnetic layer 14, the free magnetic layer 16 varies its direction of magnetization under the influence of the external magnetic field.

If a horizontal magnetic field H from the magnet 11 is applied in the X1 direction parallel to the film surfaces of the layers of the magnetoresistive effect element 12 or 13, as shown in FIG. 8, the direction of magnetization 16a of the free magnetic layer 16 varies, and the electrical resistance changes according to the relationship between the direction of magnetization 14a of the fixed magnetic layer 14 and the direction of magnetization 16a of the free magnetic layer 16. This phenomenon is referred to as a giant magnetoresistive (GMR) effect. The giant magnetoresistive effect is produced by a basic four-layered structure such as the above-mentioned layered structure including the antiferromagnetic layer 19, fixed magnetic layer 14, nonmagnetic material layer 15, and free magnetic layer 16.

When the direction of the horizontal magnetic field H is inverted from the X1 direction to the X2 direction, the direction of magnetization 16a of the free magnetic layer 16 in the magnetoresistive effect element (GMR element) 12 or 13, shown in FIG. 8, changes and coincides with the direction of the horizontal magnetic field H, so the electrical resistance does not change regardless of the horizontal magnetic field H applied to the magnetoresistive effect element 12 or 13.

Similar to the GMR element, an anisotropic magnetoresistive (AMR) effect element produces a magnetoresistive effect when the horizontal magnetic field H is applied in the direction parallel to its film surfaces. In this embodiment, AMR elements may be used as the first and second magnetoresistive effect elements 12 and 13. Unlike the GMR element, the AMR element senses the horizontal magnetic field H applied in either the X1 or X2 direction shown in FIG. 8, and can detect the both poles of the magnet 11. The AMR element, however, may undesirably cause malfunction when an external magnetic field is applied from the speaker or other element. For this reason, GMR elements capable of detecting a single pole are preferably used as the first and second magnetoresistive effect elements 12 and 13.

Figure 7:
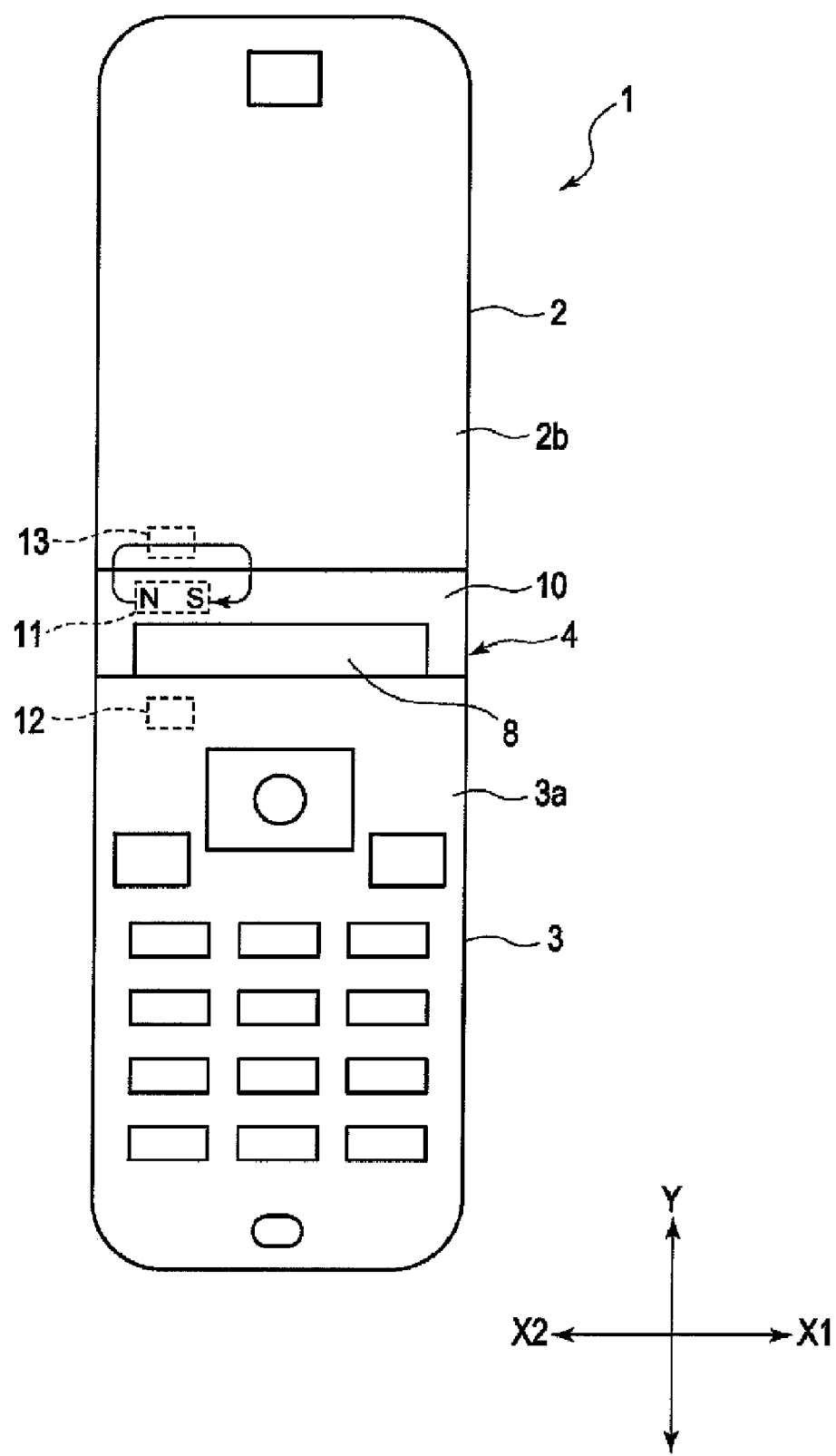
FIG. 7 is a plan view of the flip phone after the second body (display housing) is reversed (third state)

The second magnetoresistive effect element 13 shown in FIG. 8 is magnetized such that the horizontal magnetic field H in the X1 direction can be sensed when the display housing 2 is reversed to the third state shown in FIG. 7. When the display housing 2 is not reversed, i.e., in the second state shown in FIG. 1 or in the first state, the direction of magnetization 14a of the fixed magnetic layer 14 and the direction of magnetization 16a of the free magnetic layer 16 in the second magnetoresistive effect element 13 are opposite to those shown in FIG. 8. When the display housing 2 is reversed, the direction of magnetization 14a of the fixed magnetic layer 14 and the direction of magnetization 16a of the free magnetic layer 16 in the second magnetoresistive effect element 13 are oriented in the directions shown in FIG. 8, thereby enabling sensing of the horizontal magnetic field H in the X1 direction.

The first and second magnetoresistive effect elements may have different layered structures. To simplify the manufacturing process, however, the first and second magnetoresistive effect elements 12 and 13 preferably have an identical layered structure, because both the first and second magnetoresistive effect elements 12 and 13 sense the horizontal magnetic field H in the X1 direction and therefore need not have different laminated structures.

In this embodiment, tunneling magnetoresistive effect elements including the nonmagnetic material layer 15 containing an aluminum-oxide (Al—O) or titanium-oxide (Ti—O) alloy or other insulating material may be used as the first and second magnetoresistive effect elements 12 and 13. The tunneling magnetoresistive effect element also senses the horizontal magnetic field H.

The first and second magnetoresistive effect elements 12 and 13 are connected to a common detecting circuit or different detecting circuits. A common detecting circuit is advantageously used to construct a smaller circuit and hence a smaller flip phone 1. The detecting circuit has circuit elements such as a reference resistor, operational amplifier, comparator, latch circuit, input terminal, ground terminal, and output terminals.

The first magnetoresistive effect element 12 is connected to a first output terminal of the detecting circuit, and is controlled so as to output an ON signal through the first output terminal when its electrical resistance changes. Conversely, it is configured to output an OFF signal when its electrical resistance does not change.

Similarly, the second magnetoresistive effect element 13 is connected to a second output terminal of the detecting circuit, and is controlled so as to output an ON signal through the second output terminal when its electrical resistance changes and to output an OFF signal when its electrical resistance does not change.

The principles of detecting the first state, second state, third state, and fourth state will now be described. Table 1 lists signals output from the first and second output terminals in the above four states.

TABLE 1

| States In Use | First Output | Second Output |
| --- | --- | --- |
| First state (normal and closed) | ON | OFF |
| Second state (normal and opened) | OFF | OFF |
| Third state (reversed and opened) | OFF | ON |
| Fourth state (reversed and closed) | ON | ON |

In the first state shown in FIGS. 3 and 5 in which the display housing 2 is closed over the operation housing 3 and the display face 2a and the operation face 3a face inwardly, the first magnetoresistive effect element 12 is closest to the magnet 11 as shown in FIG. 5. In this state, the horizontal magnetic field H from the magnet 11 is applied to the first magnetoresistive effect element 12 and the direction of magnetization 16a of the free magnetic layer 16 changes and thereby the electrical resistance of the first magnetoresistive effect element 12 changes. Accordingly, as shown in Table 1, the first output terminal outputs an ON signal in the first state. Meanwhile, the second output terminal outputs an OFF signal because the horizontal magnetic field H from the magnet 11 is not applied to the second magnetoresistive effect element 13 located apart from the magnet 11 to cause no change in the electrical resistance.

Figure 4:
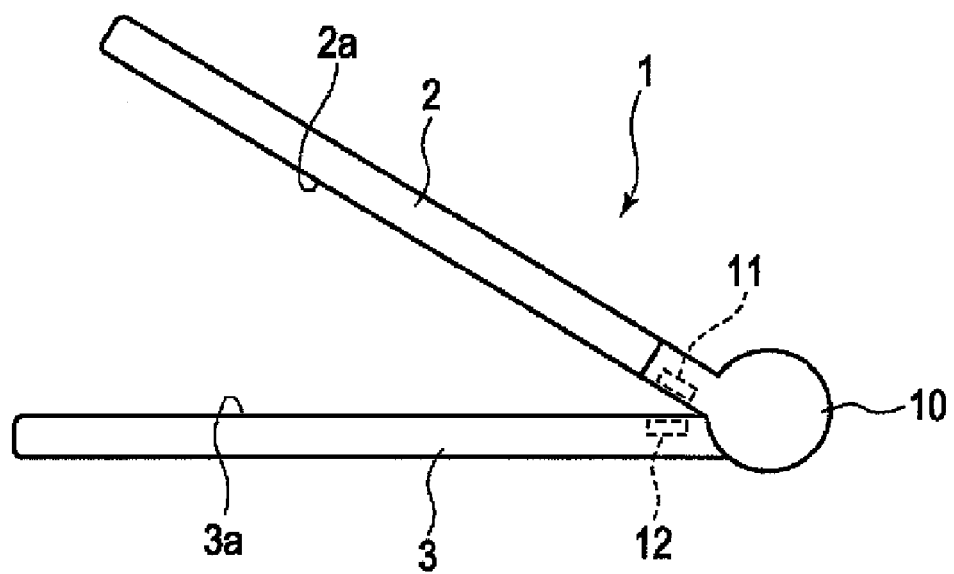
FIG. 4 is a side view of the flip phone being flipped open from the closed state shown in FIG. 3 to the opened position in FIG. 1.

When the display housing 2 is flipped open from the first state, the first magnetoresistive effect element 12 moves away from the magnet 11 as shown in FIG. 4 and accordingly the horizontal magnetic field H from the magnet 11 applied to the first magnetoresistive effect element 12 gradually weakens. In the second state shown in FIGS. 1 and 2 in which the flip phone 1 is flipped open, the first output terminal outputs an OFF signal as shown in Table 1 because the horizontal magnetic field H from the magnet 11 is no longer applied to the first magnetoresistive effect element 12 and its electrical resistance does not change. The second output terminal also outputs an OFF signal because in the second state, as in the first state, the horizontal magnetic field H of the magnet 11 is not applied to the second magnetoresistive effect element 13 located apart from the magnet 1, and thus its electrical resistance does not change.

Accordingly, in the second state, the first and second output terminals each output an OFF signal because the electrical resistances of the first and second magnetoresistive effect elements 12 and 13 do not change.

Figure 6:
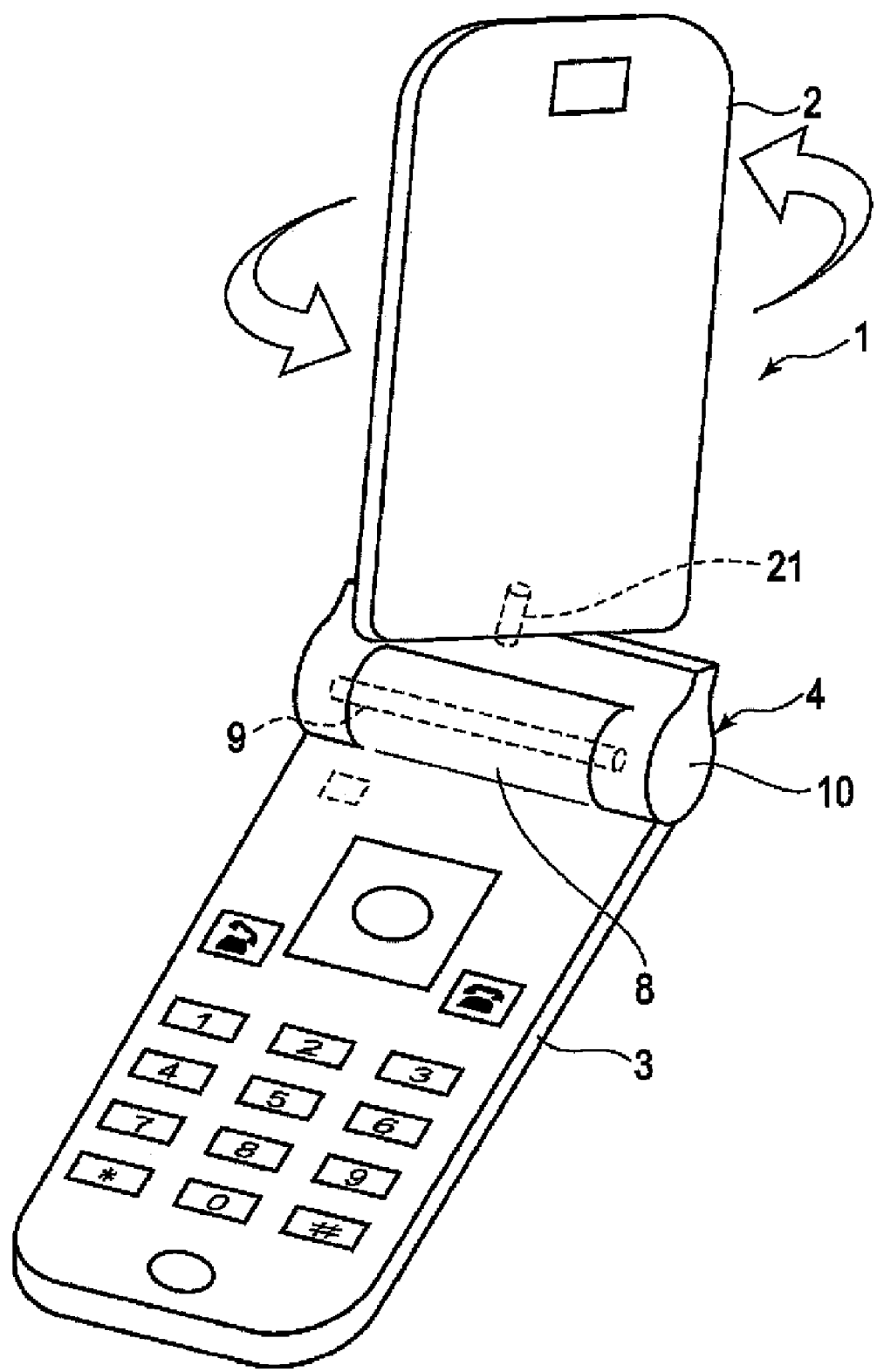
FIG. 6 is a perspective view of the flip phone with the second body (display housing) reversed from the state shown in FIG. 2.

In the third state shown in FIG. 7, the display housing 2 has been reversed as shown in FIG. 6 from the second state though 180° and the cover face (second face) 2b of the display housing 2 and the operation face 3a of the operation housing 3 are exposed in the same direction. In this state, the second magnetoresistive effect element 13 provided within the display housing 2 is closest to the magnet 11. In the third state, the second output terminal outputs an ON signal as shown in Table 1 because the horizontal magnetic field H from the magnet 11 is applied in the X1 direction to the second magnetoresistive effect element 13, and the direction of magnetization 16a of the free magnetic layer 16 varies from the direction of magnetization shown in FIG. 8 causing the electrical resistance of the second magnetoresistive effect element 13 to change. Meanwhile, the second output terminal outputs an OFF signal because the horizontal magnetic field H from the magnet 11 is not applied to the first magnetoresistive effect element 12 in the state shown in FIG. 7 to cause no change in the electrical resistance.

Next, in the fourth state in which the display housing 2 is flipped closed from the third state and the cover face 2b and the operation face 3a face inside, the first output terminal continuously outputs an ON signal because the second magnetoresistive effect element 13 and the magnet 11 are kept in the state shown in FIG. 7. In this state, similar to the state shown in FIGS. 3 and 5, the horizontal magnetic field H from the magnet 11 is applied in the X1 direction to the first magnetoresistive effect element 12 located closest to the magnet 11, and causes the direction of magnetization 16a of the free magnetic layer 16 to change as described with reference to FIG. 8, whereby the electrical resistance of the first magnetoresistive effect element 12 changes. Accordingly, the first output terminal outputs an ON signal. In the fourth state, both the first and second output terminals output ON signals.

The current state of the flip phone 1 can be identified by detecting the ON and OFF signals from the first and second output terminals, which are output in different combinations in the four states as shown in Table 1.

When the first state is identified by means of the signals from the first and second output terminals, the flip phone 1 enters a standby mode and consumes less power. When a transition from the first state to the second state is detected, indicating that the flip phone 1 enters another mode such as a "talk mode" or "mail mode," a backlight function is activated to illuminate the display screen 5 and operation buttons 6, for example. When a transition to the third state or fourth state is detected, a digital camera function, television function, or audio function is activated, for example.

As described above, the preferred embodiment of the present invention uses only one magnet in combination with two magnetoresistive effect elements to detect both the open/closed state of the phone and the normal/reversed state of the display housing 2, because the magnetoresistive effect elements 12 and 13 sense the horizontal magnetic field H, even if it is weak, and the magnetoresistive effect elements 12 and 13 and the magnet 11 are disposed as shown in FIG. 1.

The innovative flip phone 1 using only one magnet 11, instead of two as in JP-A-2006-20272, requires smaller installation space, and can accommodate the demands for making the flip phone 1 smaller and more multifunctional.

The magnet 11 may optionally be placed with its N and S magnetic poles pointing in the lengthwise direction (Y direction), instead of pointing the widthwise direction as shown in FIG. 1.

Furthermore, the second magnetoresistive effect element 13 may optionally be offset on the same side as the magnet 11 in the second state shown in FIG. 1. In this case, the second output terminal outputs an ON signal in the first state and second state in Table 1 and an OFF signal in the third state and fourth state in Table 1.

Although the present invention has been described with reference to the preferred embodiment in the context of the flip phone 1, the present invention is also applicable to game machines or other electronic devices, such as notebook computers and the like, having a first body, a second body, and a connection member coupling the second body to the first body so as to enable the second body to flip open/closed and supporting the second body so as to enable the second body to be reversed.

What is claimed is:

1. An electronic device comprising:
   a first body;
   a second body;
   a connection member located between the first and second bodies, the connection member coupling the second body to the first body to permit the second body to be flipped open/closed and reversibly supporting the second body;
   a magnet provided within the connection member;
   a first magnetoresistive effect element provided within the first body and capable of changing electrical resistance thereof under the influence of an external magnetic field, the first magnetoresistive effect element being disposed at a position where the first magnetoresistive effect element approaches the magnet so as to sense the magnetic field from the magnet when the second body is flipped closed over the first body; and
   a second magnetoresistive effect element provided within the second body and capable of changing electrical resistance thereof under the influence of an external magnetic field, the second magnetoresistive effect element being disposed at a position where the second magnetoresistive effect element approaches the magnet so as to sense the magnetic field from the magnet when the second body is reversed from a normal state or returned from the reversed state to the normal state, wherein the magnet is arranged to apply a horizontal magnetic field in a direction parallel to a film surface of the layered structure of one of the first and second magnetoresistive effect elements when the second body is flipped closed over the first body or when the second body is reversed from the normal state or returned to the normal state.

2. An electronic device according to claim 1, wherein, in a state in which the second body is flipped open and the first and second bodies are aligned in a lengthwise direction with the connection member therebetween, the magnet is offset to the right or left side of a widthwise center axis orthogonal to the lengthwise direction, and the first magnetoresistive effect element is located on the same side as the magnet with respect to the widthwise center axis, while the second magnetoresistive effect element is offset to the same side as or opposite side to the magnet with respect to the widthwise center axis.

3. An electronic device according to claim 1, wherein the connection member comprises a hinge section and an intermediate section, the hinge section being fixed to the first body, the intermediate section being supported by a first shaft extending through the hinge section so as to be rotatable thereabout together with the second body in the opening and closing directions, the intermediate section having a second shaft disposed orthogonally to the first shaft so as to allow the second body to be reversed from the normal state and returned to the normal state, and the magnet is disposed within the intermediate section.

4. An electronic device according to claim 1, wherein the first and second magnetoresistive effect elements each comprises a GMR element relying on a giant magnetoresistive effect.

5. An electronic device according to claim 1, wherein the second body has a first side which, when the second body is in the normal state and flipped closed over the first body, faces the first body, and a second side opposite to the first side, and wherein four states of the electronic device are detectable, the four states including:

a first state in which the second body is flipped closed over the first body and the first face of the second body and a front face of the first body face inside;

a second state in which the second body is flipped open from the first state and the first face of the second body and the front face of the first body are exposed in the same direction;

a third state in which the second body is reversed from the second state such that the second face of the second body and the front face of the first body are exposed in the same direction; and a fourth state in which the second body is flipped closed from the third state such that the second face of the second body and the front face of the first body face inside.

6. An electronic device according to claim 5, wherein the first side of the second body is provided with a display screen, and the front face of the first body is provided with elements used for operation of the electronic device.

7. An electronic device according to claim 6, wherein the electronic device comprises a flip phone.

8. An electronic device according to claim 2, wherein the first and second magnetoresistive effect elements each comprises a GMR element relying on a giant magnetoresistive effect.

9. An electronic device according to claim 3, wherein the first and second magnetoresistive effect elements each comprises a GMR element relying on a giant magnetoresistive effect.

* * * * *